(12) United States Patent
Onishi et al.

(10) Patent No.: US 7,397,116 B2
(45) Date of Patent: Jul. 8, 2008

(54) SEMICONDUCTOR APPARATUS AND PRODUCTION METHOD THEREOF SUITABLE FOR ELECTRIC POWER DEVICES

(75) Inventors: Hiroyuki Onishi, Aichi-ken (JP); Toshiaki Nagase, Aichi-ken (JP); Jun Ishikawa, Aichi-ken (JP); Koichi Akagawa, Aichi-ken (JP)

(73) Assignee: Kabushiki Kaisha Toyota Jidoshokki, Kariya-shi, Toyota ( * ) Notice: Subject to any disclaimer, the term of this patent is extended or adjusted under 35 U.S.C. 154(b) by 368 days.

(21) Appl. No.: 11/029,915

(22) Filed: Jan. 4, 2005

(65) Prior Publication Data
US 2005/0151167 A1    Jul. 14, 2005

(30) Foreign Application Priority Data
Jan. 8, 2004    (JP) ............................. 2004-003174

(51) Int. Cl.
*H01L 23/52* (2006.01)
*H01L 23/48* (2006.01)
(52) U.S. Cl. ...................................... 257/691; 257/693

(58) Field of Classification Search ......... 257/734–736, 257/723, 690–700
See application file for complete search history.

(56) References Cited

U.S. PATENT DOCUMENTS

| 6,873,045 | B2* | 3/2005 | Yoshizaki et al. ............ 257/735 |
| 2003/0100148 | A1* | 5/2003 | Maeno ........................ 438/128 |

FOREIGN PATENT DOCUMENTS

| CN | 1142687 A | 2/1997 |
| CN | 1155165 A | 7/1997 |
| JP | 2-130955 | 5/1990 |
| JP | 10-084077 | 3/1998 |
| JP | 2000-350475 | 12/2000 |

* cited by examiner

*Primary Examiner*—Cuong Q Nguyen
(74) *Attorney, Agent, or Firm*—Morgan&Finnegan,LLP

(57) ABSTRACT

A semiconductor apparatus is characterized in that it comprises a semiconductor module having a plurality of semiconductor elements and an external connection terminal for externally connecting electrodes of the semiconductor elements in the semiconductor module, wherein the semiconductor elements in each semiconductor module are connected in parallel and/or in series via the external connection terminal.

4 Claims, 10 Drawing Sheets

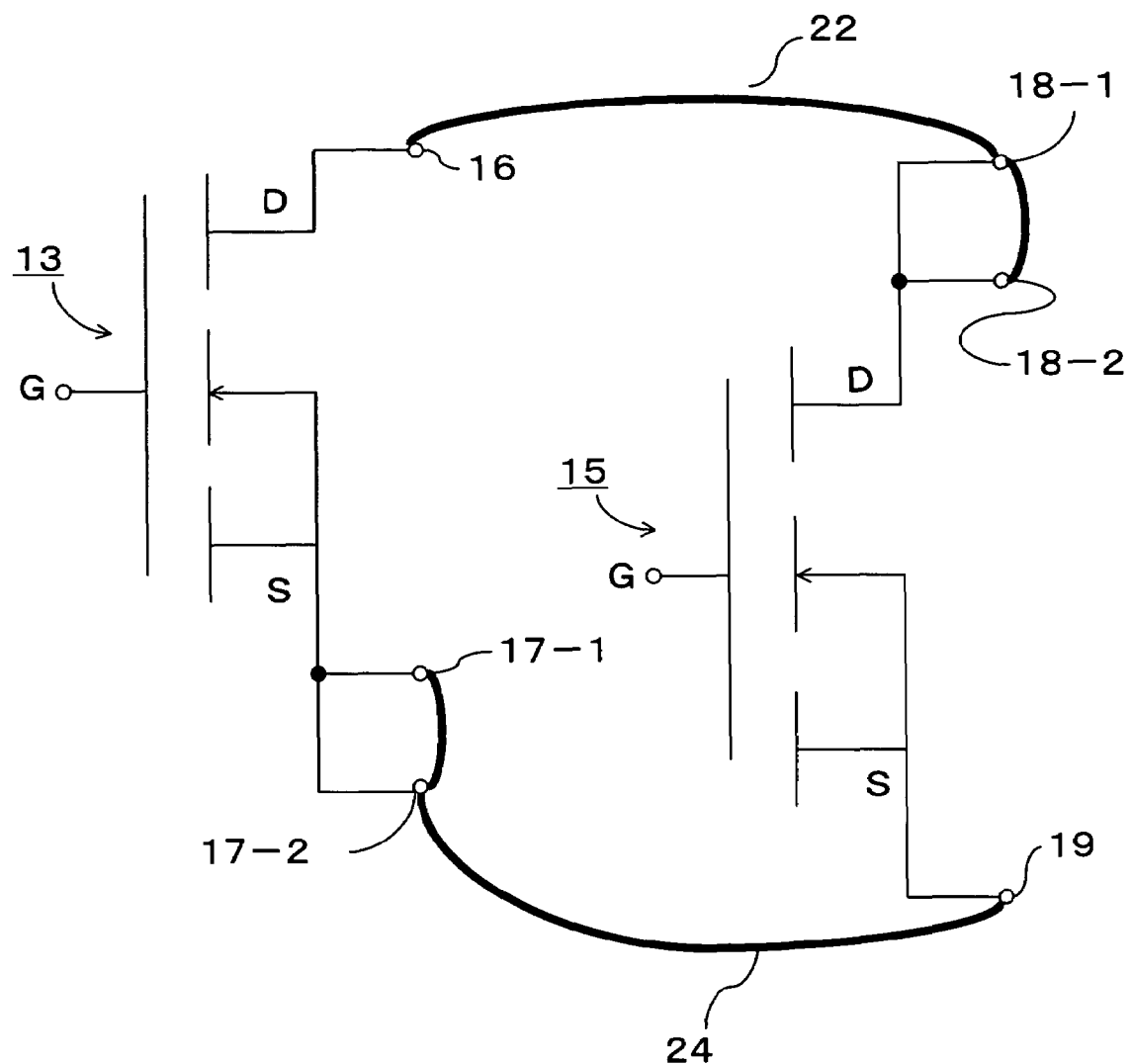
F I G. 6

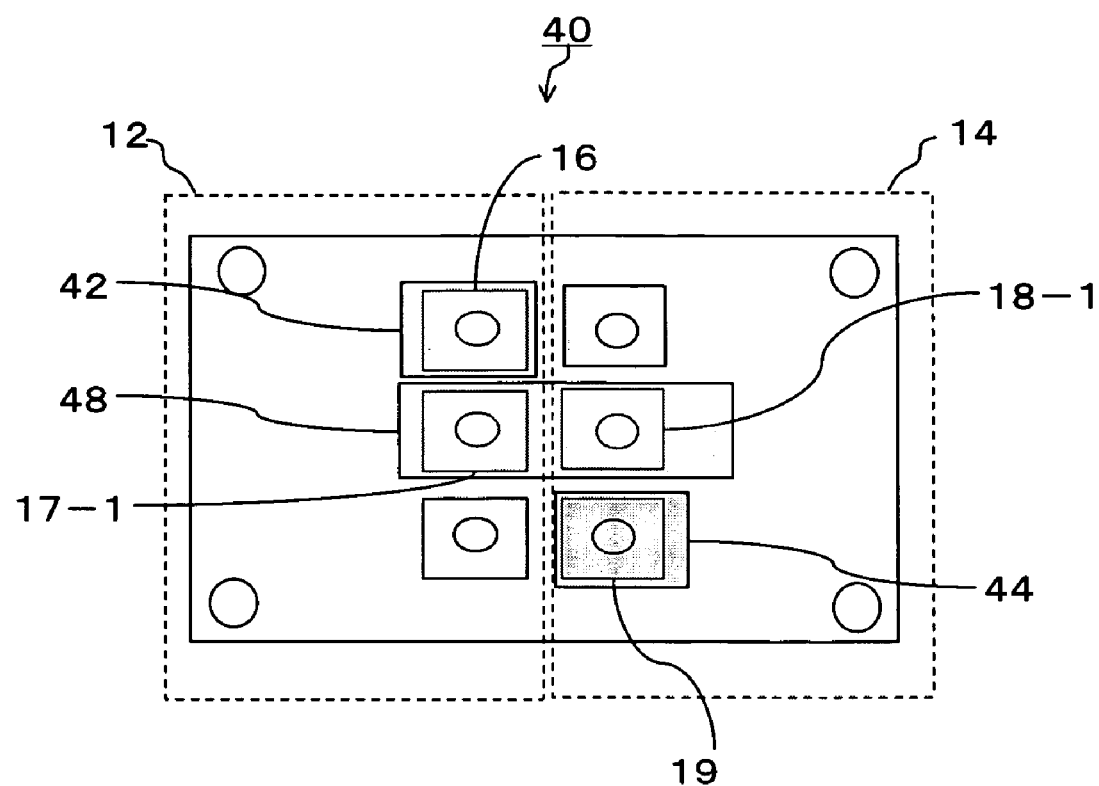
F I G. 9

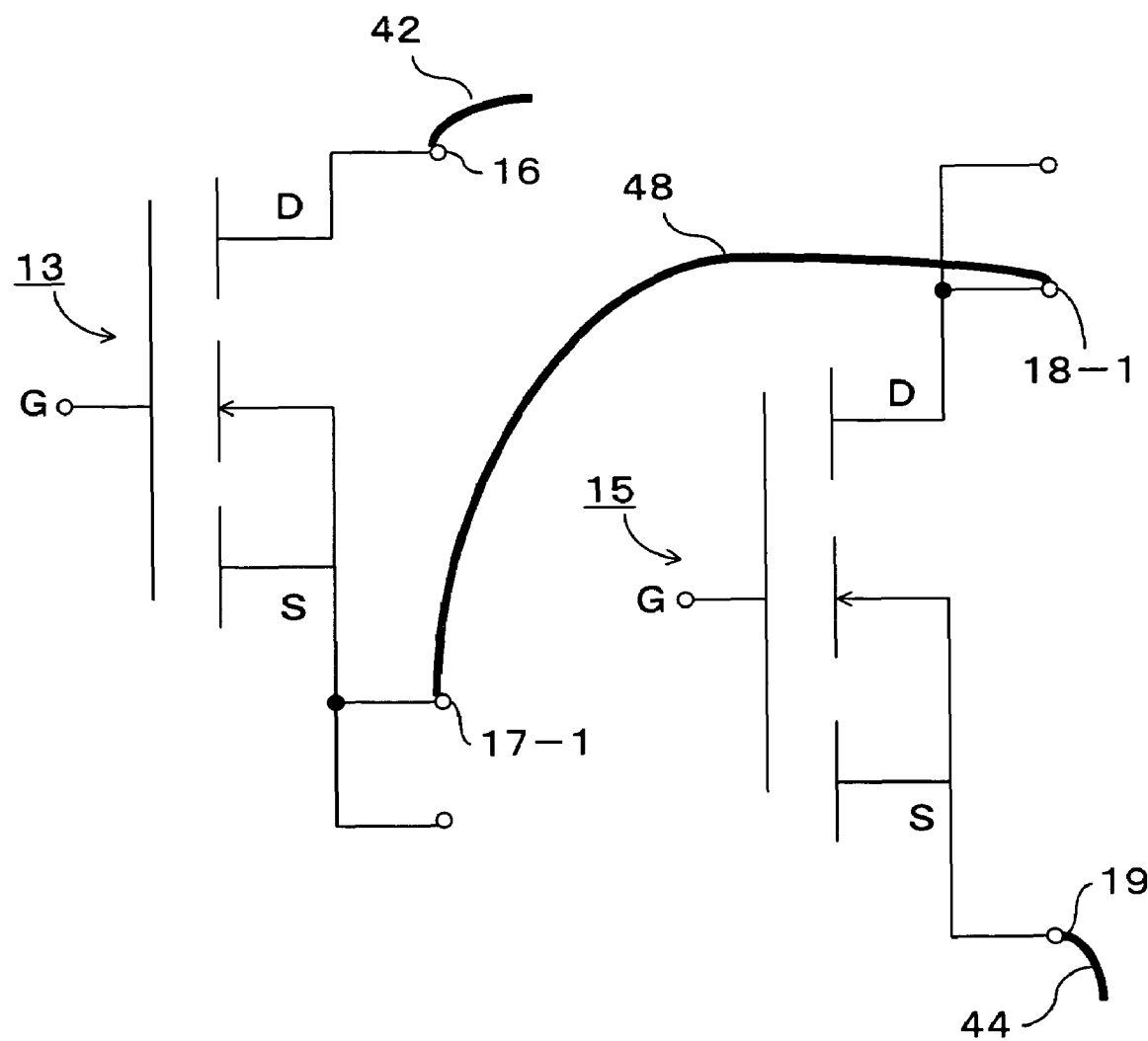
F I G. 10

SEMICONDUCTOR APPARATUS AND PRODUCTION METHOD THEREOF SUITABLE FOR ELECTRIC POWER DEVICES

BACKGROUND OF THE INVENTION

1. Field of the Invention

The present invention relates to a semiconductor apparatus and a production method thereof. Especially, it relates to a semiconductor apparatus and the production method suitable for a device for electric power.

2. Description of the Related Art

The semiconductor module indicated in the circuit as shown in FIGS. 1 and 2 has been conventionally known. FIG. 1 shows a semiconductor module 100 (so-called 2 in 1) such that two MOSFETs (Metal Oxide Semiconductor Field Effect Transistors) 101 are mounted on one insulation substrate. FIG. 2 shows a semiconductor module 200 (so-called 6 in 1) such that six MOSFETs 201 are mounted on one insulation substrate. These semiconductor modules 100 and 200 configure the arm of an inverter apparatus for driving a motor. The semiconductor module 100 is configured in such a way that two MOSFETs 101 are connected in series. Also, the semiconductor module 200 is configured in such a way that three circuits obtained by serially connecting MOSFETs 201 are connected in parallel.

In the semiconductor module provided with such a semiconductor element (semiconductor switching element) like the above-mentioned conventional MOSFET, only a product provided with an arm configuration can be used so that the use application of this product is limited. Also, in the case where the above-mentioned semiconductor modules are connected in parallel to be used, the derating of an allowable current capacity should be increased, thereby generating many wastes.

Furthermore, an IGBT (Insulated Gate Bipolar Transistor) semiconductor module obtained by connecting a plurality of IGBT semiconductor elements via an emitter terminal external connection part, a collector terminal external connection part and a gate terminal external connection part has been known. In addition, an inverter apparatus that uses this IGBT semiconductor module has been known. In this inverter apparatus, these two IGBT semiconductor modules are connected in series. In this series connection, wiring connection using bus bar wiring, etc. is used. This IGBT semiconductor module is obtained by connecting in parallel a plurality of, that is, at least two or more IGBT semiconductor elements in an inside thereof (for example, refer to a patent literature 1).

Consequently, it is necessary to produce at least several IGBT semiconductor elements even in the case where a semiconductor module with a small current capacity is produced. Therefore, there is a problem such that the production cost of the semiconductor module with a small current capacity becomes comparatively expensive. In addition, there arises a problem when the product is downsized.

[Patent literature 1] Japanese Patent Laid-open Application Publication No. 10-84077.

SUMMARY OF THE INVENTION

In the present invention, the use application of a semiconductor module is increased by connecting in parallel and/or in series semiconductor elements in a semiconductor module.

When a semiconductor apparatus is produced using the semiconductor module on which a plurality of semiconductor elements are mounted, the semiconductor elements in the semiconductor module can be connected in parallel and/or in series, which is the main characteristic of the present invention.

The present invention aims at offering a semiconductor apparatus comprising a semiconductor module having a plurality of semiconductor elements and an external connection terminal for externally connecting electrodes of the semiconductor elements in the semiconductor module. Furthermore, this semiconductor apparatus is characterized in that the semiconductor elements in each semiconductor module are connected in parallel and/or in series via an external connection terminal.

The external connection terminal is characterized in that it comprises a first external connection terminal for externally connecting first electrodes of the semiconductor elements and a second external connection terminal for externally connecting second electrodes of the semiconductor elements.

The external connection terminal is characterized in that it comprises a third external connection terminal for externally connecting a first electrode of the semiconductor element and a second electrode of another semiconductor element.

The present invention is characterized in that by externally connecting electrodes of semiconductor elements in two or more semiconductor modules via an external connection terminal, a semiconductor apparatus is produced in such a way that semiconductor elements in the semiconductor modules are connected in parallel and/or in series.

The present invention is characterized in that first electrodes of the semiconductor elements are externally connected via a first external connection terminal and second electrodes of the semiconductor elements are externally connected via a second external connection terminal.

The first external connection terminal is characterized in that it is mounted on a surface of the semiconductor module, an insulation part is mounted on the first external connection terminal and the second external connection terminal is mounted at an upper part of the insulation part and on a surface of the semiconductor module.

It is characterized in that the first electrode of the semiconductor element and the second electrode of another semiconductor element are connected via the third external connection terminal.

According to the production method of a semiconductor apparatus of the present invention, a semiconductor apparatus of the present invention with the above-mentioned operation and effect can be produced.

The present invention offers a semiconductor apparatus characterized in that this apparatus comprises first and second semiconductor modules each having at least one semiconductor element; a case for storing the first and second semiconductor modules; and a plurality of terminal conductors for deriving a main electrode of each semiconductor module to an outside of the case so that the terminal conductors of the first semiconductor module and the second semiconductor module can be connected in parallel and/or in series via an external connection terminal.

The external connection terminal is characterized in that it comprises the first external connection terminal for externally connecting terminal conductors of the first electrodes of each semiconductor module and the second external connection terminal for externally connecting terminal conductors of the second electrodes of each semiconductor module.

The external connection terminal is characterized in that it comprises the third external connection terminal for externally connecting the terminal conductor of the first electrode of the first semiconductor module to the terminal conductor of the second electrode of the second semiconductor module.

Consequently, the present invention can offer circuits in which modules are connected via various external connection terminals that implement the parallel connection and series connection of semiconductor elements, as one package of semiconductor apparatuses. In addition, in a circuit, etc. in which semiconductor elements are connected in parallel, the derating of an electric characteristic such as an allowable current capacity can be decreased by matching electric characteristics of semiconductor elements in the respective semiconductor modules. Furthermore, since only an optional number of the semiconductor elements can be connected in parallel via an external connection terminal, one package of products of many kinds can be offered as one package of semiconductor apparatuses. Accordingly, the production cost of those products can be reduced by the mass-production effect.

According to the present invention, semiconductor elements in a semiconductor module are configured to be externally connected via an external connection terminal (output to a motor) so that the semiconductor elements are externally connected to the 2 in 1. Therefore, the thus-connected module can be used as one MOS module.

According to the present invention, the semiconductor modules each having at least one semiconductor element are connected in parallel and/or in series via an external connection terminal to be offered as one package of products. Therefore, a variety of products can be provided as a package of semiconductor apparatuses. In addition, the component (the semiconductor module) can be standardized in each product so that the production cost of each product can be reduced by the mass-production effect. Furthermore, in a product such that semiconductor elements in a plurality of semiconductor modules are connected in parallel via an external connection element, the derating of the electric characteristic of an allowable current, etc. can be reduced in comparison with the conventional product such that individual semiconductor packaged products are connected in parallel. Furthermore, a package of downsized products with different maximum allowable currents can be widely produced so that an abundant product lineup can be offered to a user.

BRIEF DESCRIPTION OF THE DRAWINGS

FIG. 6 is a circuit diagram of a semiconductor apparatus of the preferred embodiment 1;

FIG. 9 is a top view of another semiconductor apparatus that is produced by externally connecting two MOS module parts on the semiconductor apparatus substrate (preferred embodiment 3); and FIG. 10 is a circuit diagram of a semiconductor apparatus of the preferred embodiment 3;

DESCRIPTION OF THE PREFERRED EMBODIMENT

The following is the detailed explanation of the preferred embodiments of the present invention in reference to the drawings.

Figure 1:
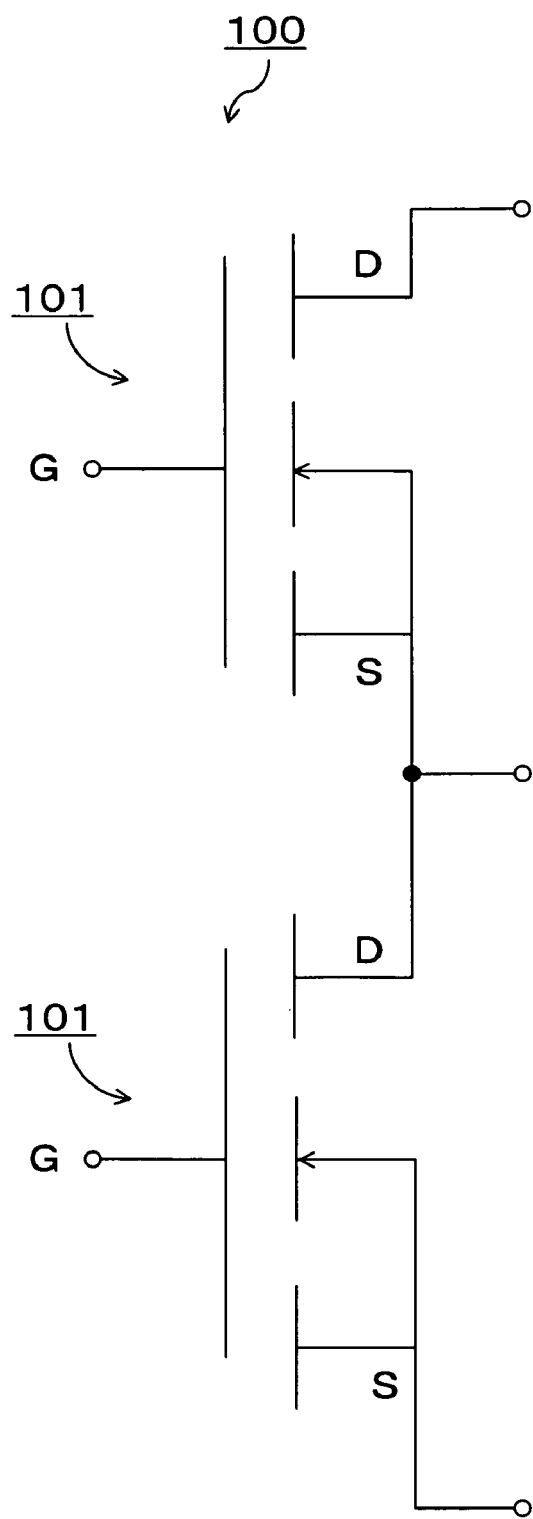
FIG. 1 shows a circuit of a conventional MOS module.
Figure 2:
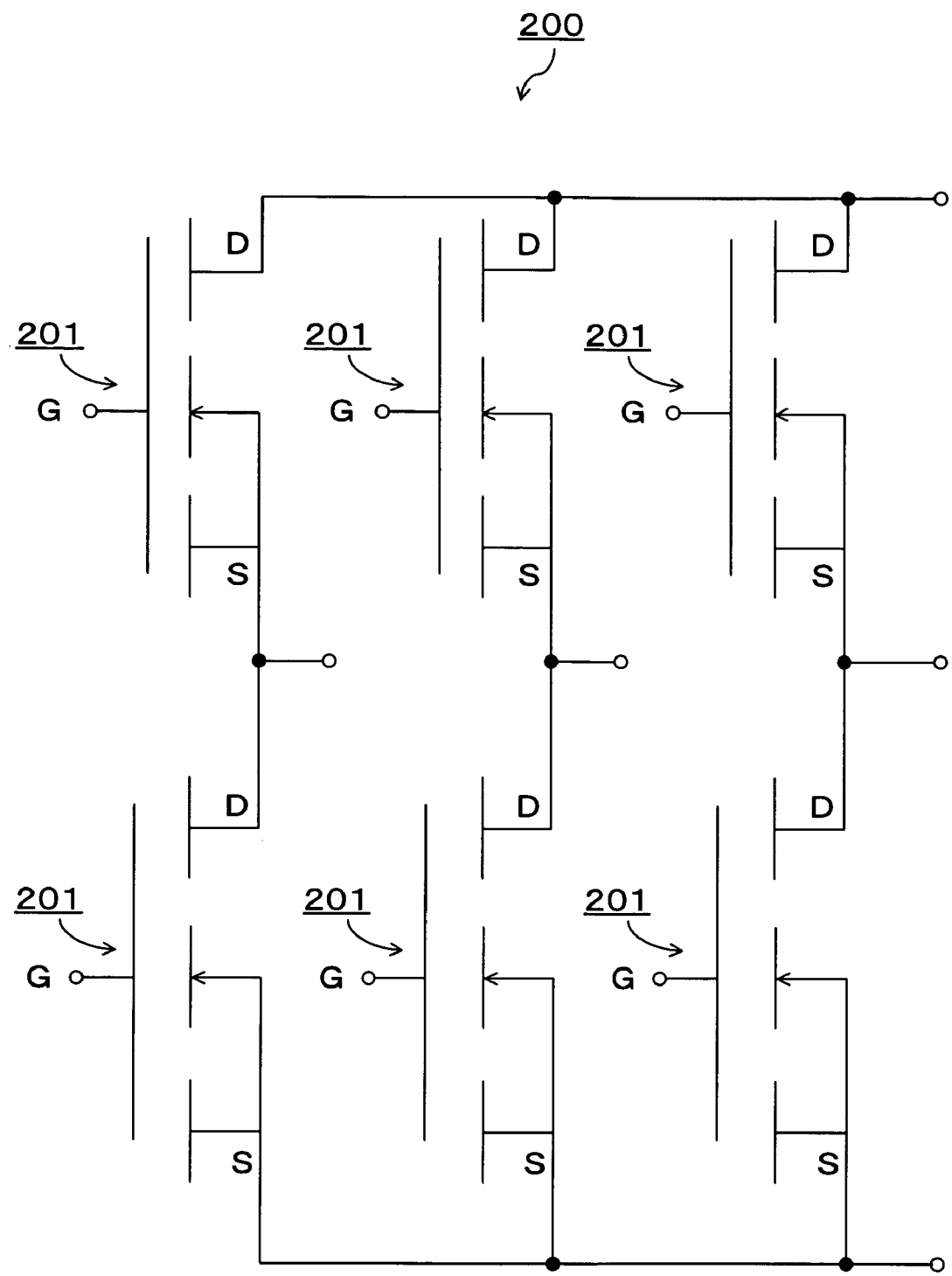
FIG. 2 shows a circuit of another conventional MOS module.
Figure 3:
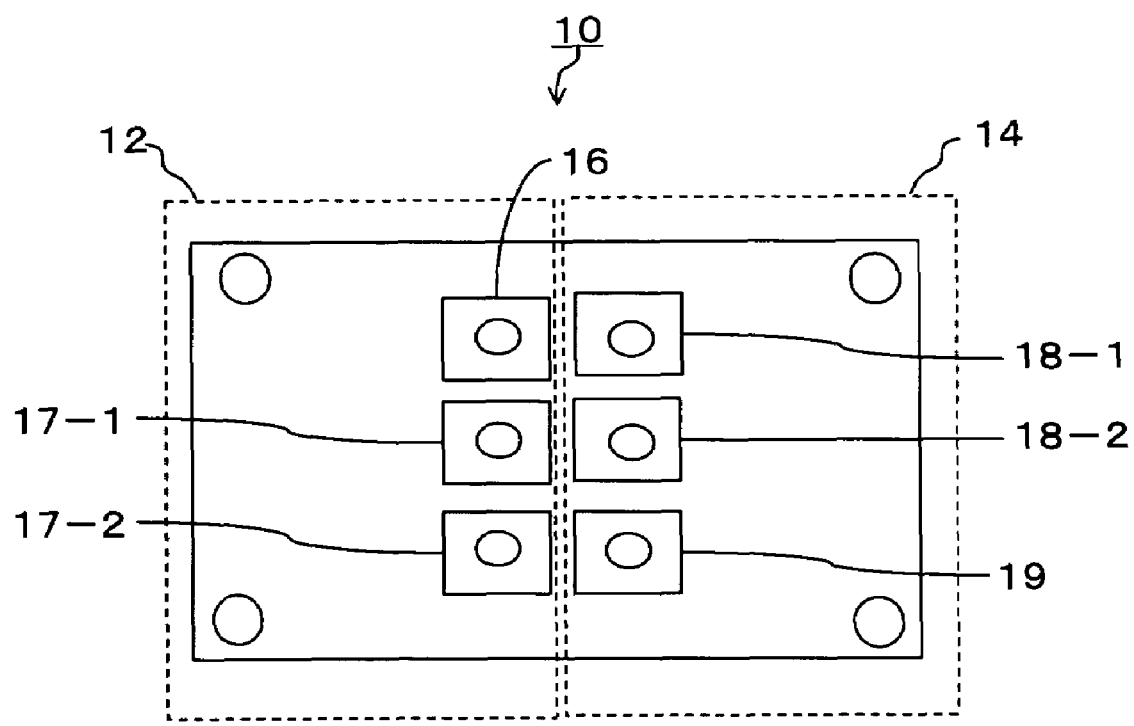
FIG. 3 is a top view of a semiconductor apparatus substrate.

FIG. 3 shows a preferred embodiment before a semiconductor apparatus of the preferred embodiment of the present invention is externally connected. The semiconductor apparatus shown in FIG. 3 is called a semiconductor apparatus substrate 10 for convenience.

A case 11 is provided with a MOS module part 12 (first MOS module part) and a MOS module part 14 (second MOS module part)

FIGS. 4(a) and (b) are the circuit diagrams of the MOS module part 12 and the MOS module part 14, respectively. As shown in FIGS. 4(a) and (b), each of the MOS module parts 12 and 14 is provided with enhancement-shaped MOSFETs (hereinafter, refer to n-MOSFET) 13 (first semiconductor module) and 15 (second semiconductor module) of an n channel in the case 11.

Figure 4:
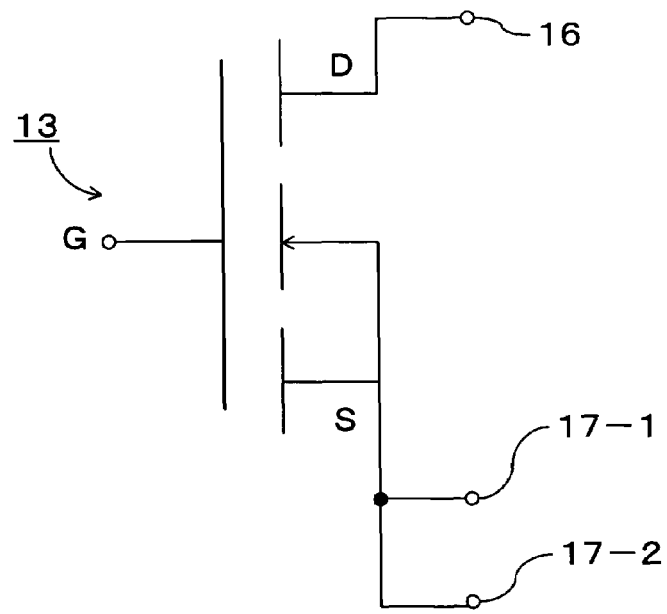
FIG. 4(a) shows the circuit of a MOS module part 12 and (b) shows the circuit of a MOS module part 14.
Figure 4:
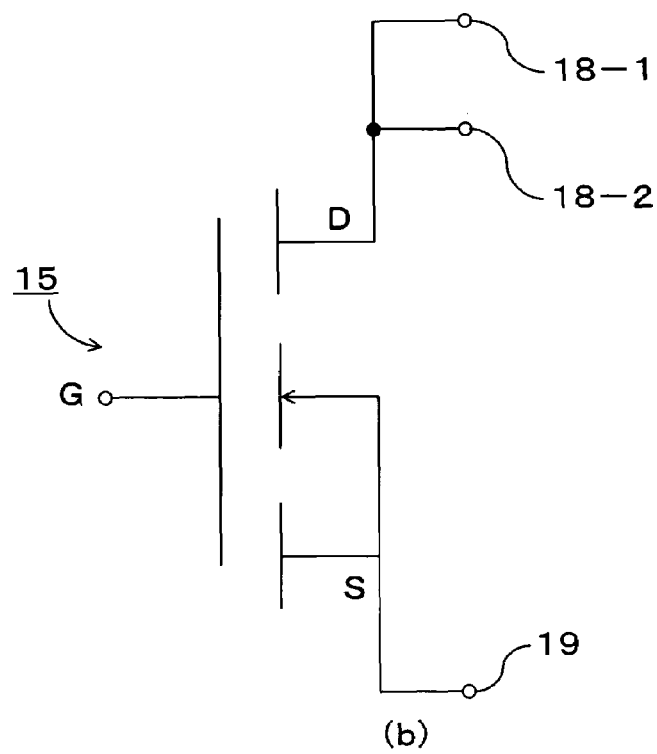

As shown in FIGS. 3 and 4, the MOS module part 12 is provided with a terminal conductor 16 to be connected to a drain electrode (D) regarding the n-MOSFET 13 and terminal conductors 17-1 and 17-2 to be connected to a source electrode (S). The MOS module part 14 is provided with terminal conductors 18-1 and 18-2 to be connected to a drain electrode (D) regarding the n-MOSFET 15 and a terminal conductor 19 to be connected to a source electrode (S). The terminal conductors 16, 17-1, 17-2, 18-1, 18-2 and 19 extend to the outside of the case 11 and they are orthogonally bent at the outside of the case 11. Each of the MOS module parts 12 and 14 is provided with a gate electrode (G) which is not shown in FIG. 3 but shown in FIGS. 4(a) and (b).

Meanwhile, the semiconductor apparatus substrate 10 that is shown in FIG. 3 is only an example. In the present invention, therefore, the arrangement and the number of terminal conductors that are connected to the drain electrode on a semiconductor apparatus substrate and the terminal conductors that are connected to a source electrode are not limited. In addition, each electrode and terminal conductors can be configured to be integrated.

Preferred Embodiment 1

Figure 5:
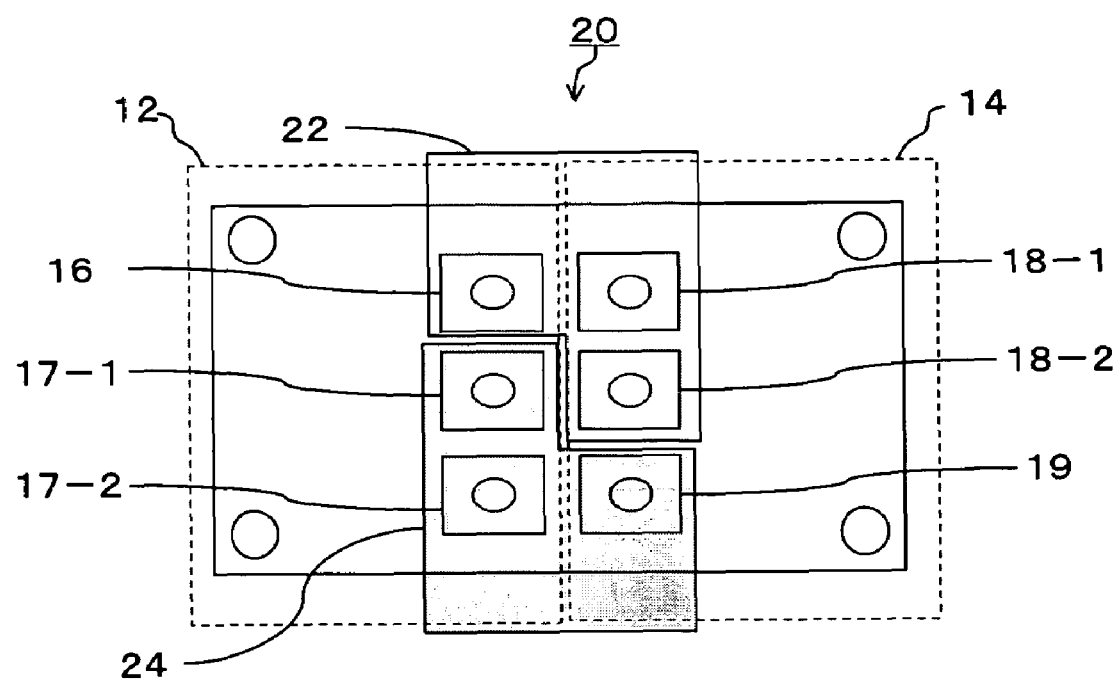
FIG. 5 is a top view of the semiconductor apparatus that is produced by externally connecting two MOS module parts on the semiconductor apparatus substrate.

FIG. 5 shows the method of producing a semiconductor apparatus in which the n-MOSFETs 13 and 15 of each of the MOS module part 12 and the MOS module part 14 are connected in parallel by externally connecting the MOS module 12 and the MOS module 14 of the semiconductor substrate 10 of FIG. 3 via external connection terminals 22, 24.

In the semiconductor apparatus 20 that is shown in FIG. 5, the terminal conductor 16 that is connected to a drain electrode of the MOS module part 12 is externally connected to the terminal conductors 18-1 and 18-2 that are connected to the first and second drain electrodes of the MOS module part 14 via a positive electrode external connection terminal 22. At the same time, the terminal conductors 17-1 and 17-2 that are connected to the first and second source electrodes of the MOS module part 12 and the terminal conductor 19 that is connected to the source electrode of the MOS module part 14 are connected via a negative electrode external connection terminal 24.

FIG. 6 shows the circuit of a semiconductor apparatus 20 produced by externally connecting module parts via such external connection terminals 22 and 24. The semiconductor apparatus 20 is a circuit in which n-MOSFETs 13 and 15 are connected in parallel via external connection terminals 22, 24.

In this way, the semiconductor apparatus 20 with the current capacity rating twice that of the n-MOSFETs 13 and 15 of each of the MOS module parts 12 and 14 can be produced by externally connecting the MOS module parts 12 and 14.

Furthermore, the derating that is usually required can be reduced by making the electric characteristics of the n-MOSFETs 13 and 15 in each of the MOS module parts 12 and 14 approximately the same.

Preferred Embodiment 2

Figure 7:
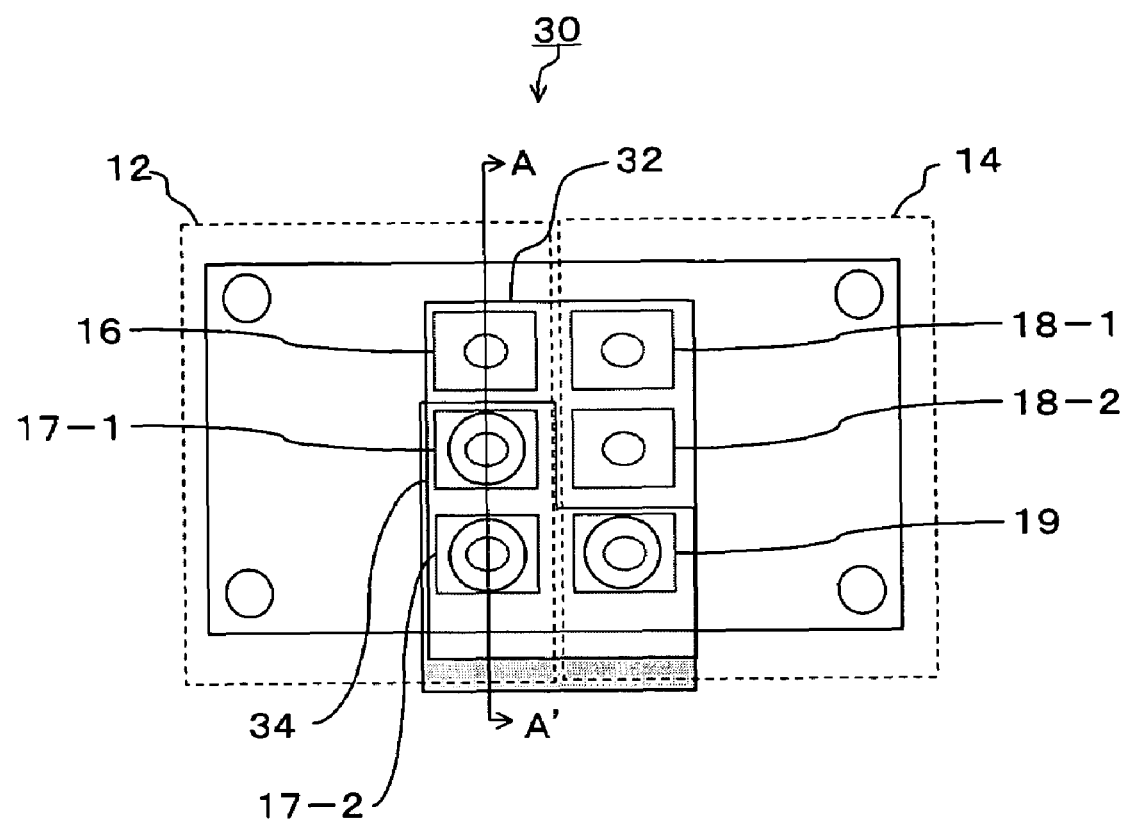
FIG. 7 is a top view of the semiconductor apparatus that is produced from the substrate of a semiconductor apparatus in such a way that an insulation part is provided between a positive electrode external connection terminal and a negative electrode external connection terminal (preferred embodiment 2)

FIG. 7 shows another semiconductor apparatus produced from the semiconductor apparatus substrate 10 of FIG. 3. A semiconductor apparatus 30 that is shown in FIG. 7 is the same as the semiconductor apparatus 20 of the preferred embodiment 1 in circuit and external connection configurations. In this apparatus 30, however, an external connection terminal 32 includes a rectangle electric conductor flat plate that covers the conductor terminals 16, 17-1, 17-2, 18-1, 18-2 and 19 while an external connection terminal 34 includes a hexagon electric conductor flat plate that covers conductor terminals 17-1, 17-2 and 19. By providing an insulation part (sheet, etc.) between the positive electrode connection terminal 32 and the negative electrode external connection terminal 34, this apparatus 30 can reduce inductance and further decrease derating in comparison with the semiconductor apparatus 20.

Figure 8:
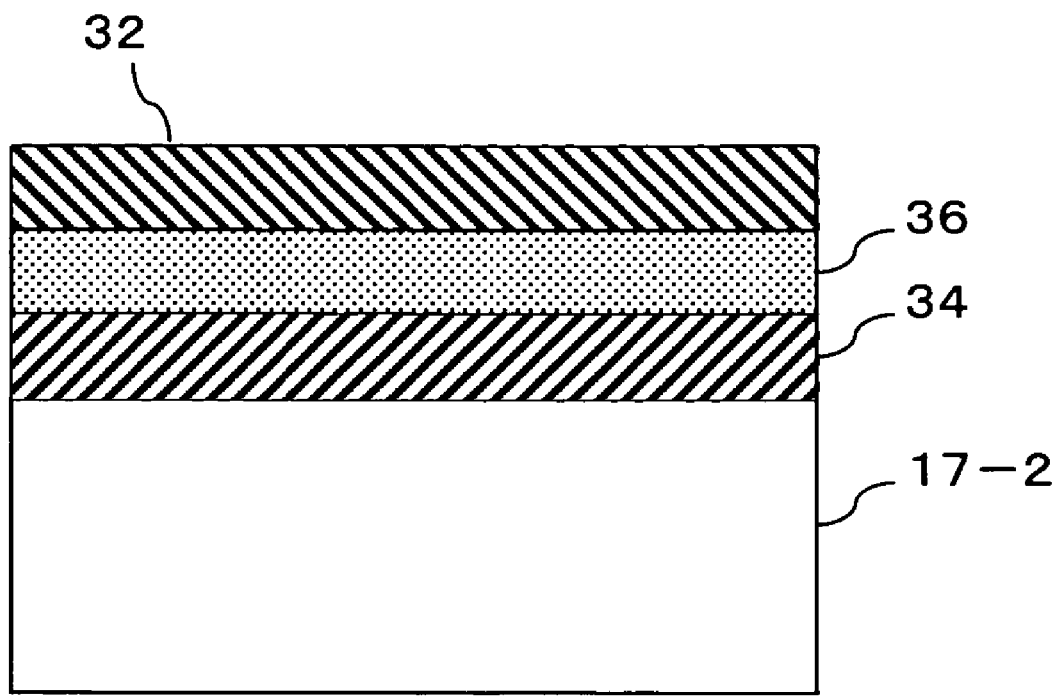
FIG. 8 is a cross-section view of the semiconductor apparatus of the preferred embodiment 2 along the line A-A' in FIG. 7.

FIG. 8 is the partial cross-section view of a periphery part of the terminal conductor 17-2 along the line A-A' of the semiconductor apparatus 30 that is shown in FIG. 7.

As shown in FIG. 8, the negative electrode external connection terminal 34 is provided on the surfaces of the MOS module parts 12 and 14 (not drawn in FIG. 8) like the shape shown in the top view of FIG. 7 and a sheet-shaped insulation part 36 is further provided so as to cover whole the negative electrode external connection terminal 34. In addition, a positive electrode external connection terminal 32 is provided on the insulation part 36. The positive electrode external connection terminal 32 is provided in the shape as shown on the top view of FIG. 7. Therefore, a part of the positive electrode external connection terminal 32 is provided on the surfaces of the MOS module parts 12 and 14. At this time, the insulation part 36 is provided in order that the positive electrode external connection terminal 32 and the negative electrode external connection terminal 34 do not contact to each other.

Each of the semiconductor apparatuses 20 and 30 of the above-mentioned preferred embodiments 1 and 2 has the circuit configuration such that two semiconductor elements are connected in parallel. The circuit configuration of the semiconductor apparatus of the present invention is not limited to this configuration and the number of the semiconductor elements that are connected in parallel can be optional.

Preferred Embodiment 3

FIG. 9 shows still another semiconductor apparatus produced from the semiconductor apparatus substrate 10 of FIG. 3.

A semiconductor apparatus 40 is configured in such a way that the MOS module parts 12 and 14 are externally connected via an intermediate external connection terminal 48 in addition to the positive electrode external connection terminal 42 and the negative electrode external connection terminal 44. FIG. 10 is the circuit diagram of the semiconductor apparatus 40.

In the semiconductor apparatus 40, the terminal conductor 17-1 that is connected to the first source electrode of the n-MOSFET 13 of the MOS module part 12 is externally connected to the terminal conductor 18-2 that is connected to the second drain electrode of the n-MOSFET 15 of the MOS module part 14, via the intermediate external connection terminal 48. Meanwhile, the positive electrode external connection terminal 42 for the terminal conductor 16 that is connected to the drain electrode of the n-MOSFET 13 of the MOS module part 12 and the negative electrode external connection terminal 44 for the terminal conductor 19 that is connected to the source electrode of the n-MOSFET 15 of the MOS module part 14 are used for, for example, the series connection between module parts.

By externally connecting the semiconductor apparatus substrate 10, the n-MOSFET 13 of the MOS module part 12 and the n-MOSFET 15 of the MOS module part 14 are serially connected. Then, a semiconductor apparatus 40 of an arm configuration is produced by externally connecting modules via an external terminal. In this semiconductor apparatus 40, two n-MOSFETs 13 and 15 are serially connected. In the present invention, however, the number of n-MOSFETs that are serially connected is not limited and the number is optional.

In the present invention, not only a circuit in which n-MOSFETs are connected in parallel like the semiconductor apparatuses 20 and 30 of the preferred embodiments 1 and 2 but also a circuit in which n-MOSFETs are connected in series like the semiconductor apparatus 40 of the preferred embodiment 3 can be configured. In addition, it is possible to produce the semiconductor apparatus 20 or the semiconductor apparatus 30 and the semiconductor apparatus 40 as one package of semiconductor apparatuses. Therefore, in the present invention, it is possible to produce as one package of semiconductor apparatuses a circuit in which n-MOSFETs are connected in parallel and in series.

Meanwhile, the semiconductor apparatus of each preferred embodiment uses the semiconductor module that is provided with an n-MOSFET as a semiconductor element. The semiconductor module that is used in the present invention can be provided with a semiconductor element other than an n-MOSFET. The semiconductor element of the present invention may include, for example, an FET, an IGBT, an SIT (Static Induction Transistor) such as a p-MOSFET, a CMOS-FET (Complementary Metal Oxide Semiconductor FET), etc., a transistor such as a bipolar transistor and a thyristor etc., such as a GTO (Gate Turn-off Thyristor).

Meanwhile, the number of the semiconductor elements that are mounted on the semiconductor module is not limited to one and an optional number can be adopted. Furthermore, the numbers of the respective semiconductor elements that are mounted on all the semiconductor modules need not be the same so that the numbers of semiconductor elements mounted on the respective semiconductor modules can be different. In addition, the types of the semiconductor elements that are mounted on the respective semiconductor modules can be different.

What is claimed is:

1. A semiconductor apparatus, comprising:
 a semiconductor module having a plurality of semiconductor elements; and an external connection terminal for externally connecting electrodes of the semiconductor elements in the semiconductor module, wherein the external connection terminal comprises a first external connection terminal for externally connecting first electrodes of the semiconductor elements and a second external connection terminal for externally connecting second electrodes of the semiconductor elements, the semiconductor elements in each semiconductor module are externally connected in parallel, and a sheet-shaped insulation part is provided between the first external connection terminal and the second external connection terminal.

2. The semiconductor apparatus according to claim 1, wherein the external connection terminal comprises a third external connection terminal for externally connecting a first electrode of the semiconductor element and a second electrode of another semiconductor element.

3. A semiconductor apparatus comprising:

first and second semiconductor modules each having at least one semiconductor element;

a case for storing the first and second semiconductor modules; and a plurality of terminal conductors for deriving a main electrode of each semiconductor module to an outside of the case, wherein the terminal conductors of the first semiconductor module and the second semiconductor module can be connected in parallel via an external connection terminal, the external connection terminal comprises a first external connection terminal for externally connecting terminal conductors of first electrodes of each semiconductor module and a second electrode external connection terminal for externally connecting terminal conductors of second electrodes of each semiconductor module, and a sheet-shaped insulation part is provided between the first external connection terminal and the second external connection terminal.

4. The semiconductor apparatus according to claim 3, wherein the external connection terminal comprises a third external connection terminal for externally connecting a terminal conductor of a first electrode of the first semiconductor module and a terminal conductor of a second electrode of the second semiconductor module.

* * * * *

UNITED STATES PATENT AND TRADEMARK OFFICE
CERTIFICATE OF CORRECTION

| | |
|---|---|
| PATENT NO. | : 7,397,116 B2 |
| APPLICATION NO. | : 11/029915 |
| DATED | : July 8, 2008 |
| INVENTOR(S) | : Hiroyuki Onishi et al. |

It is certified that error appears in the above-identified patent and that said Letters Patent is hereby corrected as shown below:

In the Specification

Column 1, lines 35-36, please delete "many wastes." and insert therefore
-- much waste. --;

Column 4, line 2, please delete "embodiment 3;" and insert therefore
-- embodiment 3. --;

Column 4, line 17, please delete "part)" and insert therefore -- part). --;

Column 4, line 37, please delete "3 but shown" and insert therefore -- 3, but is shown --;

Column 5, lines 29-30, please delete "positive electrode connection terminal 32" and insert therefore -- positive electrode external connection terminal 32 --;

Column 5, line 51, please delete "contact to each other." and insert therefore -- contact each other. --.

Signed and Sealed this

Twentieth Day of October, 2009

David J. Kappos
*Director of the United States Patent and Trademark Office*